US005764589A

United States Patent [19]
Lotfi

[11] Patent Number: 5,764,589

[45] Date of Patent: Jun. 9, 1998

[54] ARRAY ROW AND COLUMN DECODER APPARATUS AND METHOD

[75] Inventor: Younes Lotfi, Round Rock, Tex.

[73] Assignee: International Business Machines Corporation, Armonk, N.Y.

[21] Appl. No.: 828,920

[22] Filed: Mar. 28, 1997

[51] Int. Cl.⁶ ........................................ G11C 8/00
[52] U.S. Cl. ........................... 365/230.06; 365/230.01
[58] Field of Search .................. 365/230.06, 189.11, 365/230.01; 326/85, 87, 91

[56] References Cited

U.S. PATENT DOCUMENTS

| 4,051,388 | 9/1977 | Inukai | 327/213 |
|---|---|---|---|
| 4,086,500 | 4/1978 | Suzuki et al. | 326/108 |
| 4,843,261 | 6/1989 | Chappell et al. | 326/108 |
| 4,951,259 | 8/1990 | Sato et al. | 365/230.06 |
| 5,015,881 | 5/1991 | Chappell et al. | 326/108 |
| 5,018,108 | 5/1991 | Maruyama | 365/230.06 |
| 5,313,432 | 5/1994 | Lin et al. | 365/230.06 |
| 5,323,357 | 6/1994 | Kaneko | 365/230.06 |
| 5,351,217 | 9/1994 | Jeon | 365/230.06 |
| 5,363,338 | 11/1994 | Oh | 365/230.06 |
| 5,402,386 | 3/1995 | Tavrow et al. | 365/230.06 |
| 5,517,456 | 5/1996 | Chishiki | 365/230.06 |

FOREIGN PATENT DOCUMENTS

63-126326  5/1988  Japan .

*Primary Examiner*—Tan T. Nguyen
*Attorney, Agent, or Firm*—Anthony V.S. England; Kermit D. Lopez; Andrew J. Dillon

[57] ABSTRACT

An improved decoder apparatus and method for memory-array read operations are presented. The improved decoder apparatus includes a number of row decoder circuits such that each row decoder circuit includes a footed domino circuit having a pull-down device located within a pull-down path of the footed domino circuit. The improved decoder apparatus further includes a common shared node coupled to each pull-down device such that the shared common node allows the pull-down strength of each pull-down device to be increased proportionally to the number of row decoder circuits which share the common shared node, thereby promoting increased decoding operational rates and faster memory-array read operations. The pull-down device can be an N-type pull-down device. In addition, each row decoder circuit includes an address predecoder, coupled to the footed domino circuit, that receives a number of address inputs and combines address inputs into a single digital signal for utilization by the improved decoder apparatus. In addition each row decoder circuit includes a wordline driver circuit, coupled to the footed domino circuit, for providing an output of the decoder apparatus to a wordline. The improved decoder apparatus decodes address data submitted in 2B encoded format.

16 Claims, 7 Drawing Sheets

|  | BINARY | | | 2B ENCODED | | | | | |
|---|---|---|---|---|---|---|---|---|---|
|  | A0 | A1 | A2 | A0 | A1 | A2 | A3 | A4 | A5 |
| ROW0 | 0 | 0 | 0 | 0 | 1 | 0 | 1 | 0 | 1 |
| ROW1 | 0 | 0 | 1 | 0 | 1 | 0 | 1 | 1 | 0 |
| ROW2 | 0 | 1 | 0 | 0 | 1 | 1 | 0 | 0 | 1 |
| ROW3 | 0 | 1 | 1 | 0 | 1 | 1 | 0 | 1 | 0 |
| ROW4 | 1 | 0 | 0 | 1 | 0 | 0 | 1 | 0 | 1 |
| ROW5 | 1 | 0 | 1 | 1 | 0 | 0 | 1 | 1 | 0 |
| ROW6 | 1 | 1 | 0 | 1 | 0 | 1 | 0 | 0 | 1 |
| ROW7 | 1 | 1 | 1 | 1 | 0 | 1 | 0 | 1 | 0 |

ARRAY ROW AND COLUMN DECODER APPARATUS AND METHOD

BACKGROUND OF THE INVENTION

1. Technical Field

The present invention generally relates to integrated-circuit technology. In particular, the present invention relates to integrated-circuit technology and to the design of very large-scale integrated circuits. More particularly the present invention relates to the design of fast dynamic logic circuits.

2. Description of the Related Art

Dynamic logic cells which are maintained in integrated circuits in a space-efficient and wireable fashion, and which improve the speed of read operations by making array row and column selection faster is a goal sought by designers of very large-scale integrated circuits. In designing memory array circuits that include dynamic logic cells, it is highly desirable to include row and column decoders that have an efficient pitch layout. When fabricating such a circuit on a silicon wafer, it is important that the width and height of a memory cell or device such as a row decoder be minimized. Also, in the design of integrated circuits utilizing dynamic logic cells, particularly register memory arrays, it is highly desirable to employ circuits having a minimal number of active devices per stage. This reduces the cost of dynamic logic circuits, when realized in integrated-circuit form, and results in higher packing density in view of the reduced area occupied per stage. It is also highly desirable to promote faster read and write operations for dynamic logic cells utilized in random-access memory designs. This reduces delay in processing which, in turn, increases performance.

Complex logic functions can be implemented with shorter latency and smaller layout area by using dynamic logic rather than static logic. A well-known example of a technique utilizing dynamic logic is "DOMINO" (hereinafter referred to as "domino"). This technique employs clocked transistors for precharging, a pull-down network having signal inputs, a clock input for discharging, and an inverter for buffering and inverting an output signal. Due to the inversion of the output signal, it is possible to feed the output of such a domino logic circuit to the input of another domino logic circuit, and multiple logic levels can be connected for computation during the same evaluation clock phase.

Such dynamic logic circuits typically utilize MOS (metal oxide silicon) transistors in their evaluation networks, resulting in a small layout available for design. Domino logic circuits in particular are principally utilized for the implementation of non-inverting logic functions reduced to a combination of AND, OR, OR/AND, or AND/OR gates. An advantage of domino logic in particular is that such dynamic logic circuits can be utilized to implement multiple levels of logic during a single evaluation clock phase very quickly, while still maintaining an acceptable noise immunity on intermediate nodes. This is partly due to the use of inverters between logic stages.

Random-access memory designs typically utilize MOS structures in conjunction with such dynamic logic cells. In particular CMOS (complementary metal oxide silicon) structures are utilized to form such dynamic logic circuits. CMOS random-access memory designs are typically implemented utilizing a complimentary metal-oxide semiconductor process. CMOS chips are known for their extremely low power consumption and high tolerance for noise from the power supply. These characteristics make CMOS chips, including CMOS random-access memory chips, very useful in hardware components that are powered by batteries, such as most microcomputer clocks and certain types of scratch-pad random-access memories maintained by a computer operating system.

Random-access memory is semiconductor-based memory that can be read and written by a microprocessor or other hardware devices. The storage locations in a random-access memory can be accessed in any order. Dynamic random-access memory can have as few as one integrated transistor and one capacitor component per macro cell. A macro, well-known in the art of circuit design, is a library of integrated-circuit cell images. Thus, a large number of random-access memory cells can be fabricated in a small wafer area. However, because random-access memory is volatile, the stored charge on the capacitor is required to be periodically refreshed, thereby requiring, in many instances, refresh circuitry. On the other hand, the memory-refresh requirements may be left to the programmer of the microcomputer to assure that all cells have been accessed in a prescribed period of time. Random-access memory at the chip level can be classified as memory having an access time independent of the physical location of data. These constraints must be kept in mind when designing devices to be fabricated within a small wafer area.

In memory designs, the read-access time is composed of the sum of the delays of two major circuit blocks. The first of the two major circuit blocks is the front-end path, which involves circuit delays from address/clock-enabled lines to row and column select lines. The second of the two major circuit blocks is the back-end path, which involves circuit delays from bitline to the output. During read operations, the contents of the memory cell accessed by row and column are transferred to the bitlines. The data transferred to the bitlines would then be sensed or rippled through buffers to the output. Thus, any improvement to the front-end- or back-end-path circuits would directly improve the read-access time.

Thus, from the foregoing it can be seen that a need exists for an apparatus and method which result in a fast dynamic logic circuit wherein array rows and array columns are rapidly decoded. Such a device would increase the speed of read and write operations in dynamic logic circuits which utilize array row and array column decoders, thereby increasing the rate of row and column selection in such dynamic logic circuits.

SUMMARY OF THE INVENTION

It is therefore an object of the present invention to provide for an improved integrated-circuit technology.

It is another object of the present invention to provide an improved integrated-circuit technology for the design of very large-scale integrated circuits.

It is still another object of the present invention to provide for improved dynamic logic circuits which are designed in a space-efficient and wireable fashion.

It is yet another object of the present invention to provide for an improved apparatus and method for decoding array rows and columns utilized in association with fast dynamic logic circuits.

The above and other objects are achieved as is now described. An improved decoder apparatus and method for memory array read operations are presented. The improved decoder apparatus includes a number of row decoder circuits such that each row decoder circuit includes a footed domino circuit having a pull-down device located within a pull-down path of the footed domino circuit. The improved decoder apparatus further includes a common node coupled to each pull-down device such that the common node allows the pull-down strength of each pull-down device to be increased proportionally to the number of row decoder circuits which share the common node, thereby promoting increased decoding operational rates and faster memory-array read operations. The pull-down device can be an N-type pull-down device. In addition, each row decoder circuit includes an address predecoder coupled to the footed domino circuit, that receives a number of address inputs and combines address inputs into a single digital signal for utilization by the improved decoder apparatus. In addition, each row decoder circuit includes a wordline driver circuit, coupled to the footed domino circuit, for providing an output of the decoder apparatus to a wordline. The improved decoder apparatus decodes address data submitted in 2B encoded format.

DESCRIPTION OF THE DRAWINGS

The novel features believed characteristic of the invention are set forth in the appended claims. The invention itself, however, as well as a preferred mode of use, further objects, and advantages thereof, will best be understood by reference to the following detailed description of an illustrative embodiment when read in conjunction with the accompanying drawings, wherein:

DETAILED DESCRIPTION OF PREFERRED EMBODIMENT

Figure 1:
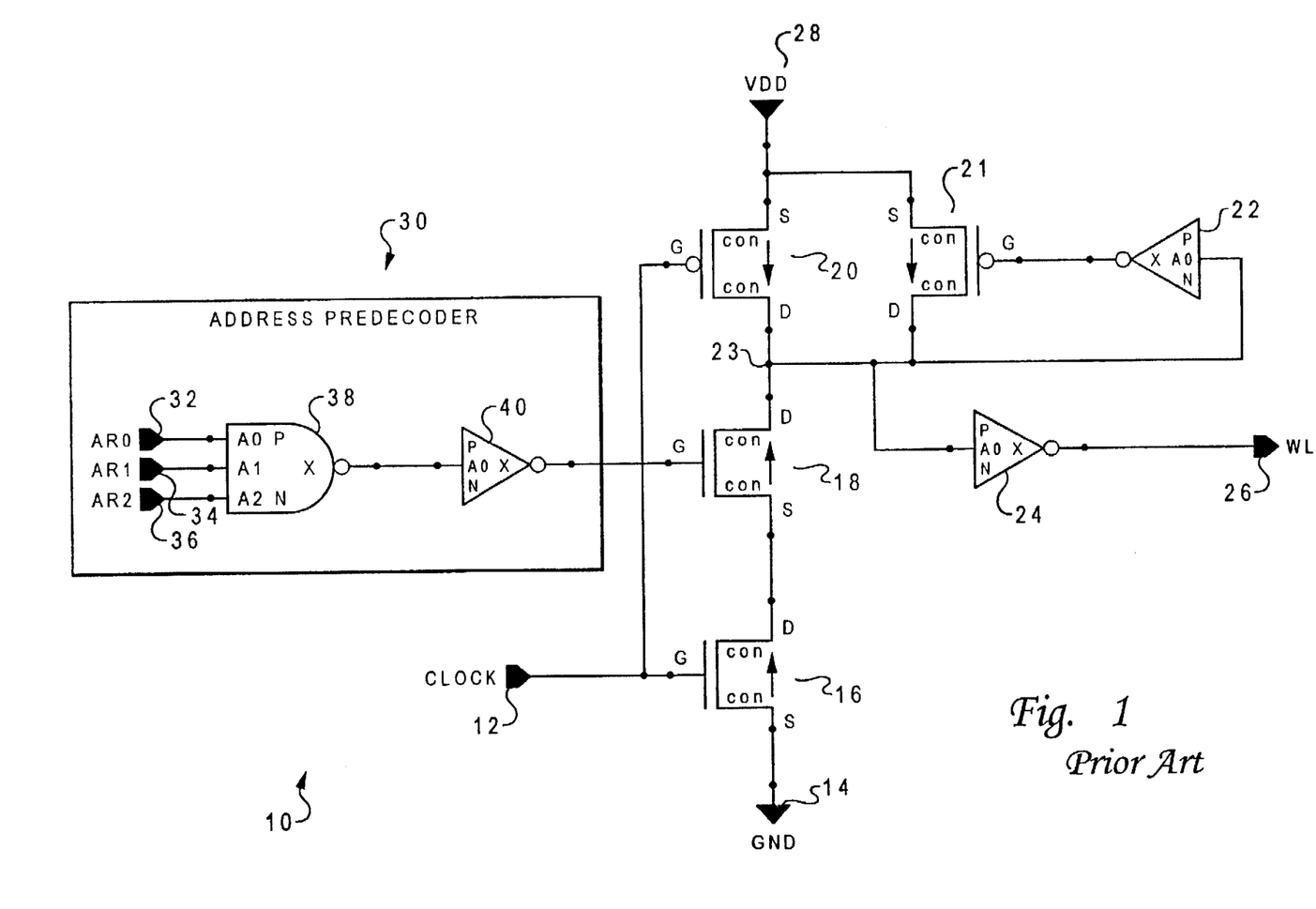
FIG. 1 is a schematic diagram of a prior-art row decoder circuit for decoding and selecting a row in a memory array.

With reference now to the figures and in particular with reference to FIG. 1, a prior-art row decoder 10 for decoding and selecting a row (i.e., wordline) in an array is depicted. Such an array is commonly utilized in random-access memory chip architectures. Memory is essentially circuitry that allows information to be stored and retrieved. In common usage, "memory" refers to the fast semiconductor storage (i.e., random-access memory) directly connected to the processor. Central to the design of such a random-access memory chip architecture is a memory array having $2^n$ by $2^m$ bits of storage. A row (or word) decoder addresses one word of $2^m$ bits out of $2^n$ words. A column (or bit) decoder addresses $2^k$ of $2^m$ bits of the accessed row. Such a column decoder can access a multiplexer, which routes addressed data to and from interfaces to the external world. Row decoder 10 includes an address predecoder 30 coupled to the gate of N-type transistor 18. Address predecoder 30 includes a NAND gate 38 with three inputs: AR0 32, AR1 34, and AR2 36. Output from NAND gate 38 is input to inverter 40. In general, such decoders are circuits that produce one or more selected output signals based on the combination of input signals that they receive. However, as elaborated herein, only one predecoder is selected at a time. In particular, the decoder of the present invention utilizes 2B encoded data, which is described in more detail in the text related to FIG. 4 herein.

A clock input is provided at the gate of N-type transistor 16. The clock input is provided by a clock (i.e., also called a system clock). Such a clock is typically an electronic circuit within a data-processing system such as a computer that generates a steady stream of timing pulses. Timing pulses are digital signals that synchronize every operation within such a data-processing system. A system clock signal typically operates at specific frequency between 1 million and 50 million cycles per second (megahertz, or MHz), and is precisely set by a quartz crystal inside the clock circuit. The clock rate of a computer, for example, is one of the prime determinants of its overall processing speed, and the clock can go as high as other components of the computer allow.

The source of N-type transistor 16 is coupled to ground 14. The drain of N-type transistor 16 is coupled to the source of N-type transistor 18. The drain of N-type transistor 18 is coupled to the drain of P-type transistor 20. The gate of P-type transistor 20 is coupled to the gate of N-type transistor 16 and clock input 12. The source of P-type transistor 20 is connected to power supply $V_{DD}$ 28, and also to the source of P-type transistor 21. The drain of P-type transistor 20 is coupled to the drain of P-type transistor 21 and to the input to inverter 24. Output from inverter 24 is coupled to wordline 26. The drain of P-type transistor 21 is also coupled to the input to inverter 22. Output from inverter 22 is tied to the gate of P-type transistor 21.

Figure 4:
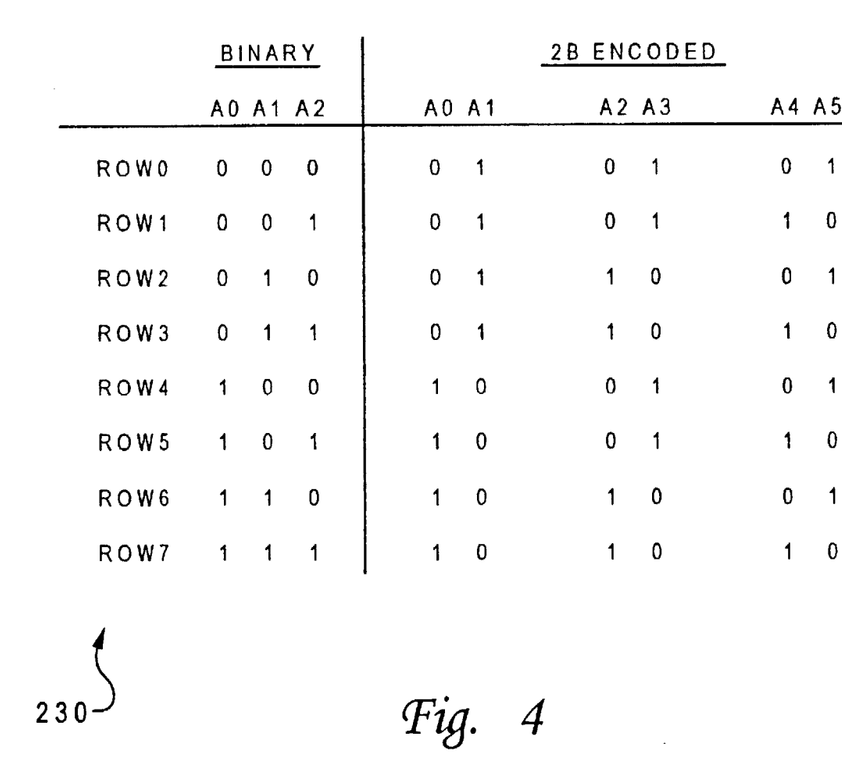
FIG. 4 depicts a table illustrating a comparison of binary and 2B encoded formats.

The three inputs to NAND gate 38, AR0 32, AR1 34, and AR2 36, are addresses in "2B" encoded format, an encoding format well-known in the art of microprocessor architecture and array design. 2B encoded format is discussed further in the text related to FIG. 4. During a read (i.e., evaluate) cycle for any address combination, only one row will be selected. During precharge phase, the CLOCK signal provided at clock input 12 is at ground potential, and node 23 is charged to $V_{DD}$ potential through two PMOS devices, P-type transistor 20 and P-type transistor 21, which form part of a footed domino circuit. Such an operation causes the output of the row decoder wordline 26 to be at ground potential regardless of the state of the addresses of NAND gate 38. During evaluate phase, the clock signal provided by a system clock to clock input 12 is charged to $V_{DD}$ potential, and this turns off the two PMOS devices, P-type transistor 20 and P-type transistor 21, which form a portion of a footed domino circuit.

During evaluate phase, a row or wordline is elected when all three addresses, AR0 32, AR1 34, and AR2 36, rise to $V_{DD}$ potential at the selected row decoder. The output of unselected rows will remain at ground potential. A wordline is selected (i.e., wordline 26 is charged to $V_{DD}$ potential) when node 23 is discharged to ground potential through a conductive path formed by two NMOS devices in the pulldown path of the footed domino circuit. Node 23 is fed to an inverter (i.e., wordline driver) 24, which causes wordline 26 to be charged to $V_{DD}$ potential. The output of the unselected rows are kept at ground potential during evaluate phase. The performance of row decoder 10 is limited by the layout area and device sizes, because row decoders or column decoders are pitch circuits and device sizes cannot be made very large in such circuits. Thus, row decoder 10 can be described as a type of circuit that produces a selected output signal based on the combination of input signals that it receives.

Figure 2:
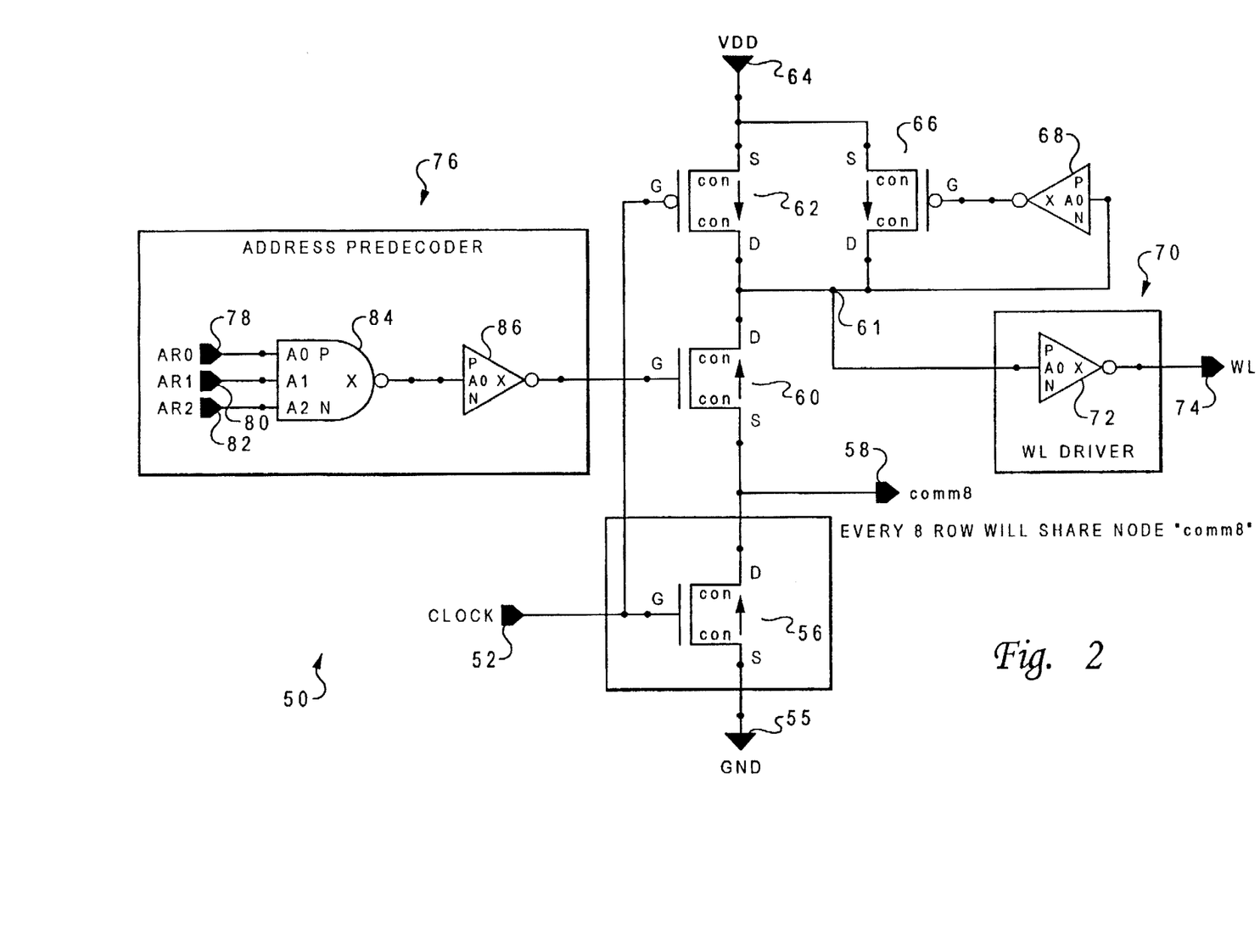
FIG. 2 is a schematic diagram of an improved row decoder circuit for decoding and selecting a row in a memory array which can be utilized in accordance with the apparatus and method of the present invention.

FIG. 2 is a schematic diagram of an improved row decoder 50 for decoding and selecting a row (i.e., wordline) in a memory array which can be utilized in accordance with apparatus and method of the present invention. The design presented in FIG. 2 improves the speed of row or column decoding without adding extra devices or utilizing larger-sized devices. Row decoder 50 includes an address predecoder 76 and a wordline driver 70. Address predecoder 76 includes three inputs, AR0 78, AR1 80, and AR2 82, which are fed to NAND gate 84. Output from NAND gate 84 is tied to the input to inverter 86. Output from inverter 86 and hence, address predecoder 76, is connected to N-type transistor 60.

P-type transistor 62 is connected at its gate to the gate of N-type transistor 56. The source of N-type transistor 56 is tied to ground 55. The gate of N-type transistor 56 is also tied to clock input 52. The drain of N-type transistor 56 is coupled to the node comm8 58, and also to the source of N-type transistor 60. The drain of N-type transistor 60 is tied to the drain of P-type transistor 62 at node 61. The source of P-type transistor 62 is tied to $V_{DD}$ 64, and also to the source of P-type transistor 66. The drain of P-type transistor 66 is tied to node 61 and to wordline driver 70.

Wordline driver 70 includes inverter 72 whose input is tied to node 61 and whose output is coupled to wordline 74. Node 61 is further tied to the input of inverter 68 whose output is tied to the gate of P-type transistor 66. In FIG. 2, N-type transistor 56 is positioned at the bottom of a stack of transistors which include N-type transistor 56, N-type transistor 60, and P-type transistor 62. This stack of transistors, in conjunction with P-type transistor 66 and inverter 68 form a footed domino circuit. Such a domino circuit implements a dynamic logic circuit. Thus, the footed domino circuit employs clocked transistors for precharging, a pull-down network having signal inputs, a clock input for discharging, and an inverter for buffering and inverting an output signal. Due to the inversion of the output signal, it is possible to feed the output of such a domino logic circuit to the input of another domino logic circuit, and multiple logic levels can be connected for computation during the same evaluation clock phase.

During read (i.e., evaluate) cycle for any address combination there will be one row selected. During precharge phase, the CLOCK signal at clock input 52 is at ground potential, and node 61 is charged to $V_{DD}$ potential through two PMOS devices, P-type transistor 62 and P-type transistor 66, which form part of a footed domino circuit. This causes the output of the row decoder wordline 74 to be at ground potential regardless of the state of the addresses, AR0 78, AR1 80, and AR2 82, to the NAND gate 84. During evaluate phase, the CLOCK signal provided at clock input 52 is charged to $V_{DD}$ potential, and this turns off the two PMOS devices, P-type transistor 62 and P-type transistor 66,
in the footed domino circuit. During evaluate phase, a row or a wordline is selected when all three address inputs, AR0 78 AR1 80, and AR2 82, to NAND gate 84 rise to $V_{DD}$ potential at the selected row decoder. The output of the unselected rows will be at ground potential. A wordline is selected (i.e., wordline 74 is charged to $V_{DD}$ potential) when node 61 is discharged to ground potential through the conductive path of two NMOS devices, N-type transistor 56 and N-type transistor 60, in the pull-down portion of the footed domino circuit formed by inverter 68, P-type transistors 62 and 66, and N-type transistors 60 and 56.

For any given address combination, only one of the row decoders will select a wordline, while the remaining row decoders are inactive. The output of NAND gate 84 in the unselected rows will be at $V_{DD}$ potential, and will turn off the NMOS device—N-type transistor 60—at the top of the pull-down path. Because of the orthogonality (i.e., only one row being selected for any address combination), the drain of N-type transistor 56, at the bottom of the stack, can be connected to the drain of the same NMOS device on other rows.

In view of the above, it can be seen that the present invention provides for an improved speed performance of row or column decoders by realizing the circuit taught in FIG. 2 as described herein. In FIG. 2, the drain of N-type transistor 56 is connected to the same NMOS devices on other rows at node 58. By making the bottom NMOS device (i.e., N-type transistor 56) large enough to accommodate the pull-down of multiple smaller circuits, particularly at node 58, any number of rows can share the common drain node of N-type transistor 56 in the pull-down path of the footed domino circuit formed by the aforementioned transistor stack, along with P-type transistor 66 and inverter 68. Such an arrangement effectively provides improved wordline select speed and read-access time.

Figure 3:
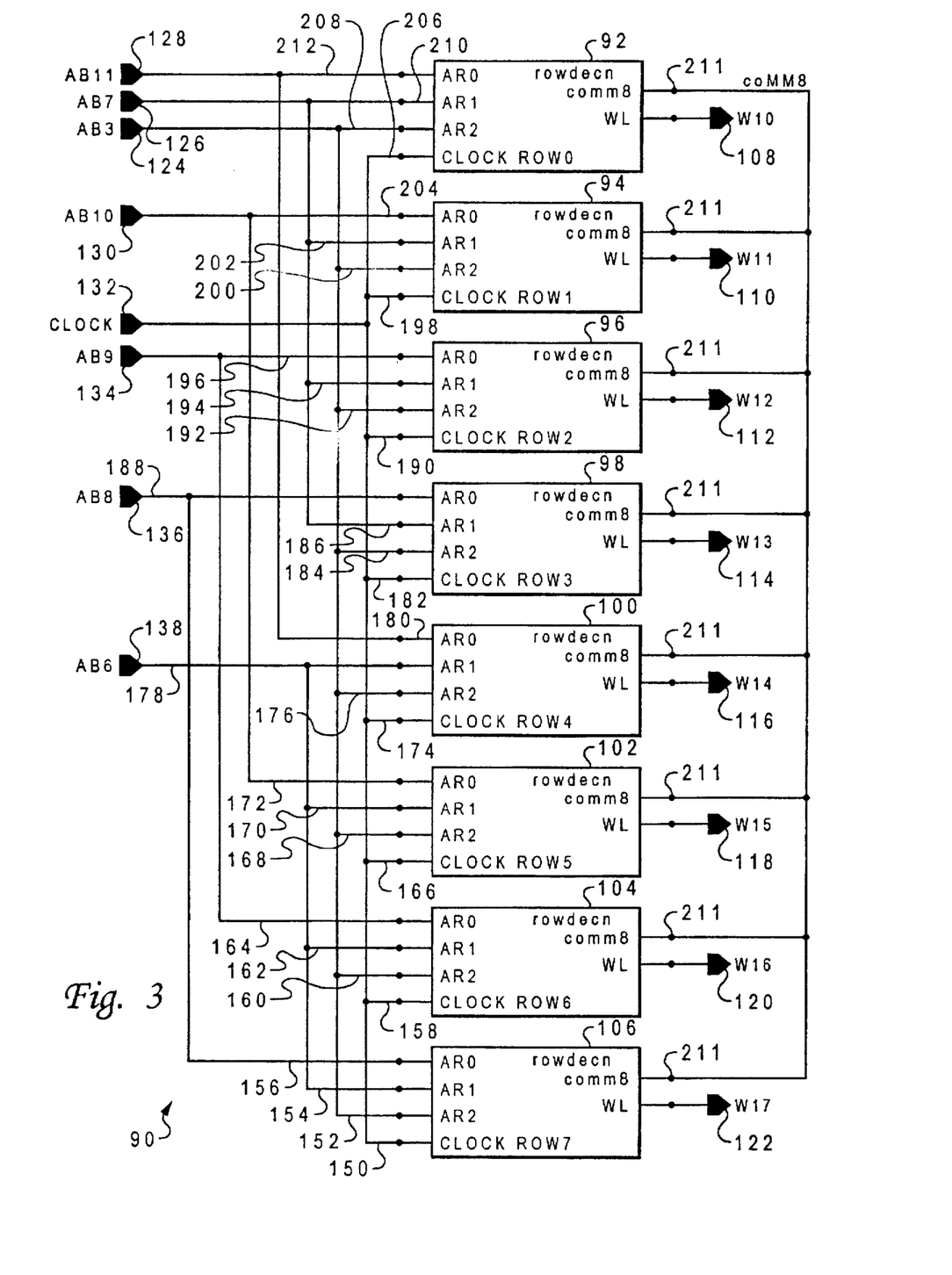
FIG. 3 is a schematic diagram of an improved multiple row decoder circuit in which rows can share a common drain node of an NMOS device in a pulldown path of a footed domino circuit in accordance with the apparatus and method of the present invention.

FIG. 3 is a schematic diagram of a multiple row decoder circuit 90 in which rows can share a common drain node of an NMOS device in a pull-down path of a footed domino circuit in accordance with the apparatus and method of the present invention. Due to the presence of such a commonly shared node, only one row address is read at a time by the row decoder. When one address read by a particular row decoder an "on" state, the other row decoders remain in an "off" state. Multiple row decoder circuit 90 includes a variety of row decoders linked to one another over varying clock and address lines. Row decoder 92 includes address inputs AR0 212, AR1 210, and AR2 208. Also included with row decoder 92 is a clock row input 206. Clock address inputs AR0 212, AR1 210, and AR2 208 are analogous to address inputs AR0 78, AR1 80, and AR2 82 depicted in FIG. 2. Row decoder 92 also includes a wordline output 108 and a shared common node comm8 211 which is shared with the other row decoders in the multiple row decoder circuit 90. In addition, AB11 128 is coupled to address input AR0 212. AB7 126 is connected to address input AR1 210. AB3 124 is tied to address input 208. Clock 132 is connected to clock row input 206.

Row decoder 94 includes address inputs AR0 204, AR1 202, and AR2 200. Also included with row decoder 96 is a clock row input 198. Clock address inputs AR0 204, AR1 202, and AR2 200 are analogous to address inputs AR0 78, AR1 80, and AR2 82 depicted in FIG. 2. Row decoder 94 also includes a wordline output 110 and a shared common node comm8 211 which is shared with the other row decoders in the multiple row decoder circuit 90. In addition, AB10 130 is coupled to address input AR0 204. AB7 126 is connected to address input AR1 202. AB3 124 is tied to address input 200. Clock 132 is connected to clock row input 198.

Row decoder 96 includes address inputs AR0 196, AR1 194, and AR2 192. Also included with row decoder 96 is a clock row input 190. Clock address inputs AR0 196, AR1 194, and AR2 192 are analogous to address inputs AR0 78, AR1 80, and AR2 82 depicted in FIG. 2. Row decoder 96 also includes a wordline output 112 and a shared common node comm8 211 which is shared with the other row decoders in the multiple row decoder circuit 90. In addition, AB9 134 is coupled to address input AR0 196. AB7 126 is connected to address input AR1 194. AB3 124 is tied to address input 192. Clock 132 is connected to clock row input 190.

Row decoder 98 includes address inputs AR0 188, AR1 186, and AR2 184. Also included with row decoder 98 is a clock row input 182. Clock address inputs AR0 188, AR1 186, and AR2 184 are analogous to address inputs AR0 78, AR1 80, and AR2 82 depicted in FIG. 2. Row decoder 98 also includes a wordline output 114 and a shared common node comm8 211 which is shared with the other row decoders in the multiple row decoder circuit 90. In addition, AB8 136 is coupled to address input AR0 188. AB7 126 is connected to address input AR1 186. AB3 124 is tied to address input 184. Clock 132 is connected to clock row input 182.

Row decoder 100 includes address inputs AR0 180, AR1 178, and AR2 176. Also included with row decoder 100 is a clock row input 174. Clock address inputs AR0 180, AR1 178, and AR2 176 are analogous to address inputs AR0 78, AR1 80, and AR2 82 depicted in FIG. 2. Row decoder 100 also includes a wordline output 116 and a shared common node comm8 211 which is shared with the other row decoders in the multiple row decoder circuit 90. In addition, AB11 128 is coupled to address input AR0 180. AB6 138 is connected to address input AR1 178. AB3 124 is tied to address input AR2 176. Clock 132 is connected to clock row input 174.

Row decoder 102 includes address inputs AR0 172, AR1 170, and AR2 168. Also included with row decoder 102 is a clock row input 166. Clock address inputs AR0 172, AR1 170, and AR2 168 are analogous to address inputs AR0 78, AR1 80, and AR2 82 depicted in FIG. 2. Row decoder 102 also includes a wordline output 118 and a shared common node comm8 211 which is shared with the other row decoders in the multiple row decoder circuit 90. In addition, AB10 130 is coupled to address input AR0 172. AB6 138 is connected to address input AR1 170. AB3 124 is tied to address input AR2 168. Clock 132 is connected to clock row input 166.

Row decoder 104 includes address inputs AR0 164, AR1 162, and AR2 160. Also included with row decoder 104 is a clock row input 158. AR0 164, AR1 162, and AR2 160 are analogous to address inputs AR0 78, AR1 80, and AR2 82 depicted in FIG. 2. Row decoder 104 also includes a wordline output 120 and a shared common node comm8 211 which is shared with the other row decoders in the multiple row decoder circuit 90. In addition, AB9 134 is coupled to address input AR0 164. AB6 138 is connected to address input AR1 162. AB3 124 is tied to address input AR2 160. Clock 132 is connected to clock row input 158.

Row decoder 106 includes address inputs AR0 156, AR1 154, and AR2 152. Also included with row decoder 106 is a clock row input 150. Clock address inputs AR0 156, AR1 154, and AR2 152 are analogous to address inputs AR0 78, AR1 80, and AR2 82 depicted in FIG. 2. Row decoder 106 also includes a wordline output 122 and a shared common node comm8 211 which is shared with the other row decoders in the multiple row decoder circuit 90. In addition, AB8 136 is coupled to address input AR0 156. AB6 138 is connected to address input AR1 154. AB3 124 is tied to address input AR2 152. Clock 132 is connected to clock row input 150.

The device described herein improves the speed of row and column decoding without adding any extra devices or making existing device sizes larger. In point of fact, because of the presence of a shared common node at the drain of each pull-down device within each footed domino circuit, the row decoder circuit described herein increases the speed of row selection by effectively making the pull-down strength of the NMOS pull-down device located at the bottom of the footed domino circuit larger. With this particular method, any number of rows can share the common node of the NMOS pull-down device. In the illustrative embodiment described herein, eight individual row decoder circuits comprise an overall multiple row circuit. Thus, with the individual row decoder circuits configured in FIG. 3 for eight rows, the speed of the pull-down device is improved, without: the need for increasing device sizes or adding extra devices.

FIG. 4 depicts a table 230 illustrating a comparison of binary and 2B encoded formats. As shown in table 230, a 2B encoded format differs from a binary format. Thus, for a given binary address having 000 binary, such binary data is translated in 2B format as 010101. Likewise, a binary address such as 001 is reflected in 2B encoded format as 010110. The present invention depicted herein is preferably implemented utilizing a 2B encoded format. Thus, in the configuration depicted in FIG. 3, data encoded as 2B encoded data is sent input to the row decoder. Utilizing 2B encoded format data with the configuration shown in FIG. 3 allows one predecoder circuit to be selected by a row decoder while the other predecoder circuits remain in an "off" state.

Figure 5:
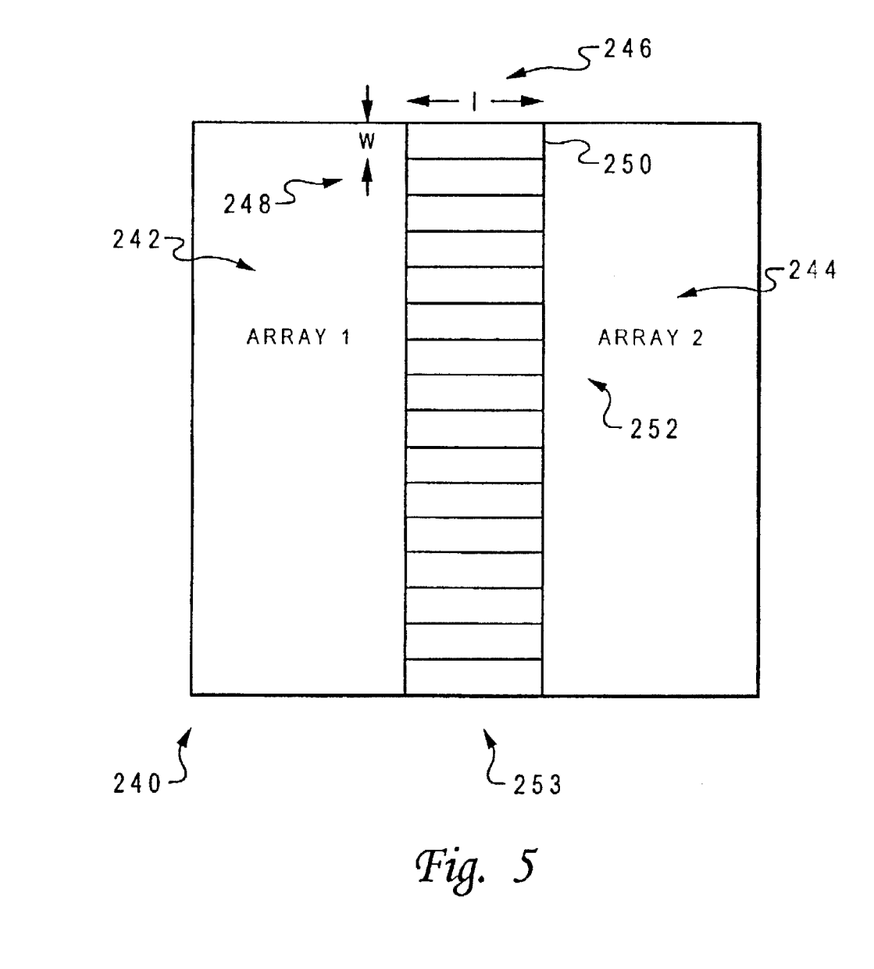
FIG. 5 illustrates an example layout of arrays in which row decoder circuits such as the row decoder circuits described herein can be utilized in accordance with the apparatus and method of the present invention.

FIG. 5 illustrates an example layout of arrays in which row decoder circuits such as the row decoder circuits described herein can be utilized in accordance with the apparatus and method of the present invention. In FIG. 5, layout 240 depicts two array regions, array region 242 and array region 244. Positioned between these two array regions is a row decoder region 253 in which sixteen individual row decoders 250 are positioned. Each row decoder 250 has a width 248 and a length 246. The width 248 of each row decoder 250 is determined by the length of the array cells (i.e., not shown) adjacent each row decoder 250. The length 246 of each row decoder 250 can vary, while the width 248 remains constant.

Figure 6:
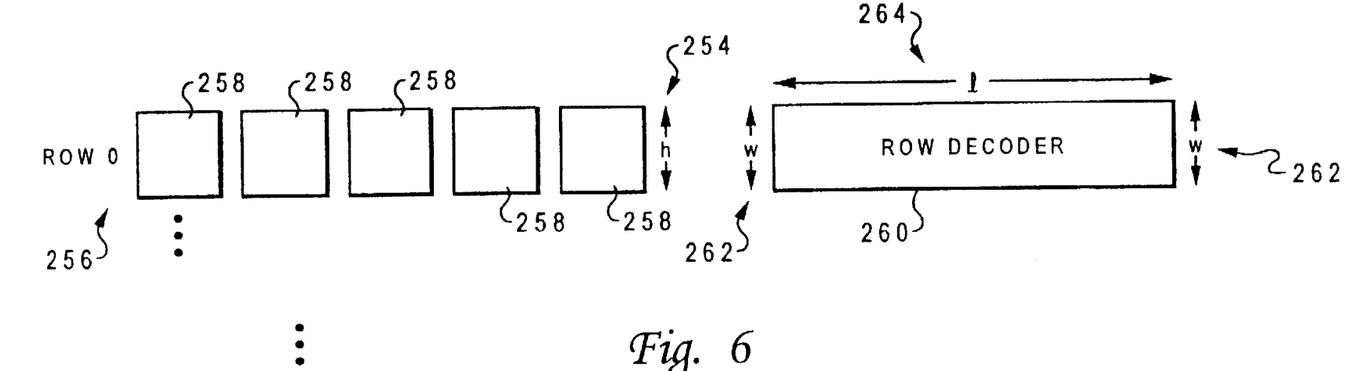
FIG. 6 illustrates an example of an individual row of cells which are positioned adjacent the row decoder in accordance with the apparatus and method of the present invention.

FIG. 6 illustrates an example of an individual row 256 of cells 258 which are positioned adjacent row decoder 260. Cells 258 can sit in an array such as array region 242 of FIG. 5 Row decoder 260 depicted in FIG. 6 is analogous to row decoder 250 depicted in FIG. 5. Row decoder 260 has a width 262 that is dependent upon the height "h" 254 of memory cells 258 contained within the row 256. It can be appreciated from the configurations of FIG. 5 and FIG. 6 that, in order to save space within such a configuration, the length 264 of a row decoder must be reduced due to the fact that the width 262 can only be expanded or reduced according to the height "h" 254 of a cell 258.

Figure 7A:
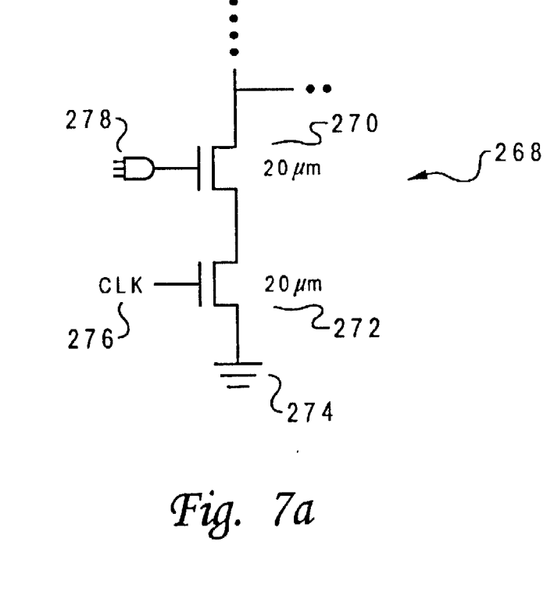
FIG. 7A and 7B illustrate a comparison of a portion of a prior-art pull-down circuit with a portion of a pull-down circuit that can be utilized in accordance with the apparatus and method of the present invention.
Figure 7B:
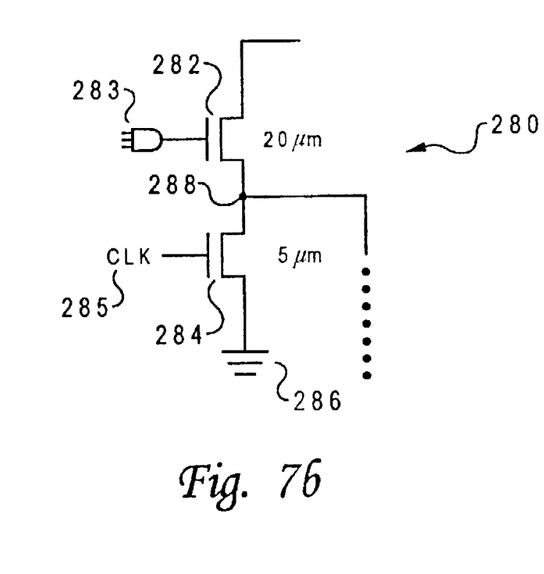

FIG. 7 illustrates a comparison of a portion of a prior-art pull-down circuit with a portion of a pull-down circuit that can be utilized in accordance with the apparatus and method of the present invention. FIG. 7(a) depicts a portion 268 of a circuit such as the circuit depicted in FIG. 1. Device 278 shown in FIG. 7(a) is analogous to the address predecoder 30 depicted in FIG. 1. Clock 276 shown in FIG. 7(a) is analogous to clock 12 depicted in FIG. 1. N-type transistor 270 shown in FIG. 7(a) is analogous to N-type transistor 18 depicted in FIG. 1. N-type transistor 272 shown in FIG. 7(a) is analogous to N-type transistor 16 shown in FIG. 1. N-type transistor 270 has a width of 20 μm. N-type transistor 272 has a width of 20 μm and is coupled to ground 274. FIG. 7(b) depicts a portion 280 of a circuit analogous to the circuit depicted in FIG. 2. Device 283 shown in FIG. 7(b) is analogous to address predecoder 76 depicted in FIG. 2.

Clock 285 shown in FIG. 7(b) is analogous to clock 52 shown in FIG. 2. N-type transistor 282 shown in FIG. 7(b) is analogous to N-type transistor 60 depicted in FIG. 2. N-type transistor 284 shown connected to ground 286 in FIG. 7(b) is analogous to N-type transistor 56 depicted in FIG. 2. N-type transistor 282 has a width of 20 μm, and N-type transistor 284 has a width of 5 μm. In addition, a common node 288 is shared by other row decoder circuits having identical values to form a circuit such as the circuit depicted in FIG. 3. Thus, common node 288 is analogous to the common shared node comm8 58 depicted in FIG. 2 and comm8 211 depicted in FIG. 3. Thus, it can be appreciated by one skilled in the art that a row decoder such as row decoder 260 shown in FIG. 6 that utilizes a configuration of transistors such as that depicted in FIG. 7(b) requires less space due to the smaller width (i.e., 5 μm) of the smaller N-type transistor.

Figure 8A:
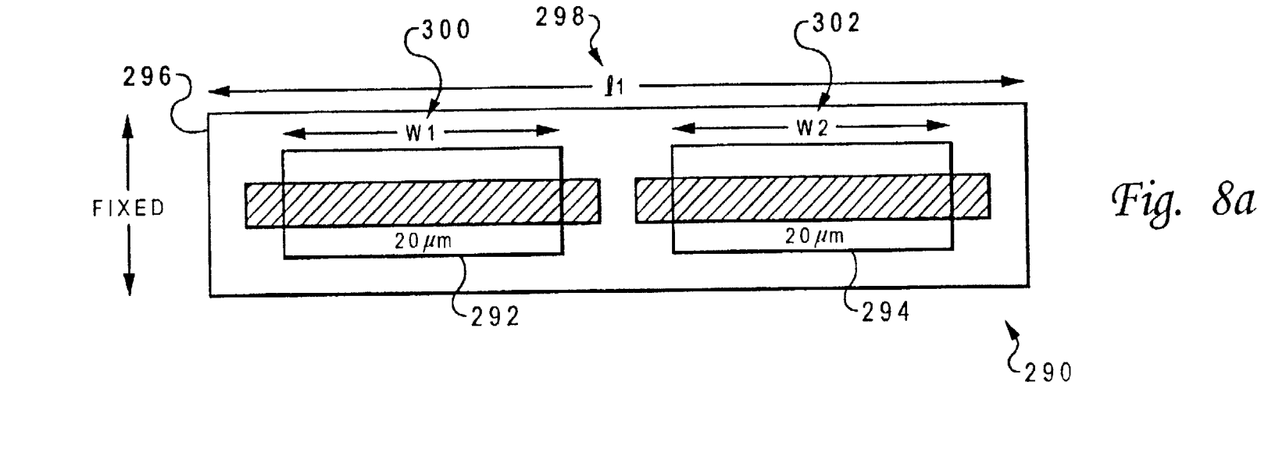
FIGS. 8A and 8B illustrates a comparison of a portion of a prior-art layout of a pull-down circuit with a portion of a layout of a pull-down circuit that can be utilized in accordance with the apparatus and method of the present invention.

FIG. 8 illustrates a comparison of a portion of a prior-art layout of a pull-down circuit with a portion of a layout of a pull-down circuit that can be utilized in accordance with the apparatus and method of the present invention. The layouts depicted in FIG. 8 can be implemented utilizing a computer aided design (CAD) device or manually (i.e., drawn by hand.). Implementation of such layouts are well known in the art of integrated-circuit design. FIG. 8(a) shows a portion 290 of a row decoder in which layout symbols for two transistors having identical widths are disposed. Transistor 292 shown in FIG. 8(a) is analogous to N-type transistor 270 depicted in FIG. 7(a). Transistor 292 has a width 300 of 20 μm. Transistor 294 shown in FIG. 8(a) is analogous to N-type transistor 272 depicted in FIG. 7(a) Transistor 294 has a width 302 that is also 20 μm. FIG. 8(a) thus specifically depicts a portion 290 of a row decoder circuit.

Figure 8B:
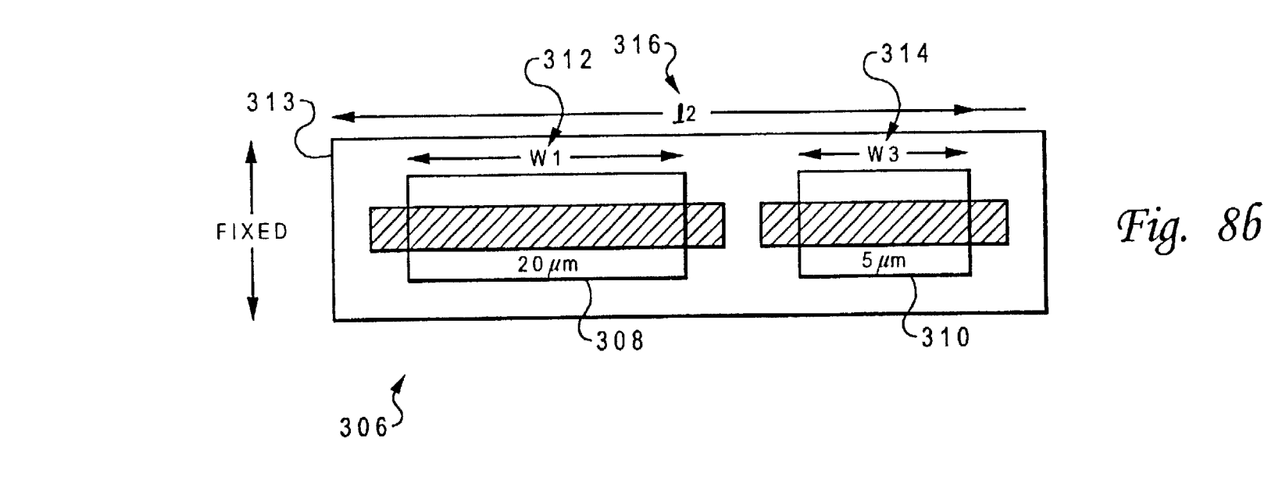

The length L1 298 of portion 290 is thus dependent upon the size of the transistors maintained within the row decoder. The width 296 of the row decoder is fixed according to the height of any adjacent memory-array cells (not shown in FIG. 8). FIG. 8(b) shows a portion 306 of a row decoder in which is disposed layout symbols of two transistors having different widths. Transistor 308 is analogous to N-type transistor 282 depicted in FIG. 7(b). Transistor 308 has a width 312 of 20 μm. Transistor 310 is analogous to N-type transistor 284 depicted in FIG. 7(b). Transistor 310 has a width 314 of 5 μm. Portion 306 of the row decoder has a length L2 316 and a fixed width 313. Width 313 is fixed according to the height of any adjacent memory-array cells (not shown). It can be appreciated from a comparison of the examples depicted in FIG. 8(a) and FIG. 8(b) that length L2 316 is less than length L1 298. Thus, the configuration depicted in FIG. 8(b) demands less space due to the smaller width (i.e., 5 μm) of transistor 310 in comparison to transistor 302.

In standard pull down devices of footed domino circuits, the strength of a pull down circuit is limited by the size of the pull down devices that fit in the pitch. The "pitch" is a term utilized in the art of integrated-circuit design and fabrication that refers to the availability of space within a given area. Thus, any improvement in tight pitch areas naturally leads to improvements in the general operation of a circuit, including the speed at which a circuit operates. In the present invention, the use of a common node as described herein allows for the use of pull-down transistors having a decreased width while, at the same time, allowing for parallel transistors that operate with the same strength or stronger of a single transistor. For example, eight pull-down transistors in parallel such as transistor 56 of FIG. 2 each having a width of 5 μm and a common node 58 have the equivalent strength of a single transistor with a width of 40 μm. For array and column decoding, any decrease in pitch cell length, in association with an increase in effective transistor strength, increases speed.

While the invention has been particularly shown and described with reference to a preferred embodiment, it will be understood by those skilled in the art that various changes in form and detail may be made therein without departing from the spirit and scope of the invention. The embodiments and examples set forth herein were presented in order to best explain the present invention and its practical application and to thereby enable those skilled in the art to make and use the invention. However, those skilled in the art will recognize that the foregoing description and examples have been presented for the purposes of illustration and example only. The description as set forth is not intended to be exhaustive or to limit the invention to the precise form disclosed. Many modifications and variations are possible in light of the above teaching without departing from the spirit and scope of the following claims.

What is claimed is:

1. An improved decoder apparatus for memory-array read operations, comprising:

a plurality of row decoder circuits wherein each row decoder circuit among said plurality of row decoder circuits includes a footed domino circuit having a pull-down device located within a pull-down path of said footed domino circuit; and a shared common node coupled to each pull-down device wherein said shared common node allows a pull-down strength of each pull-down device to be increased proportionally to the number of row decoder circuits having said shared common node, thereby promoting increased decoding operational rates and faster memory-array read operations.

2. The decoder apparatus of claim 1 wherein said pull-down device comprises an N-type pull-down device.

3. The decoder apparatus of claim 2 wherein each row decoder circuit further comprises:

an address predecoder, coupled to said footed domino circuit, for receiving a plurality of address inputs and combining said plurality of address inputs into a single digital signal for utilization by said decoder apparatus; and wordline driver circuit, coupled to said footed domino circuit, for providing an output of said decoder apparatus to a wordline.

4. The decoder apparatus of claim 3 wherein said address predecoder further comprises:

a NAND gate which includes an output and at least one input coupled to at least one address; and a first inverter which includes an output and an input coupled to said output of said NAND gate.

5. The decoder apparatus of claim 4 wherein said wordline driver circuit further comprises a third inverter having an output connected to a wordline and an input coupled to an input of a second inverter.

6. The decoder apparatus of claim 5 wherein said N-type pull-down device comprises a first N-type transistor wherein a source of said first N-type transistor is coupled to ground and a drain of said first N-type transistor is connected to said shared common node.

7. The decoder apparatus of claim 6 wherein said footed domino circuit further comprises:

said input of said second inverter coupled to a drain of a second P-type transistor and to a drain of a first P-type transistor and to a drain of a second N-type transistor;

said first P-type transistor having a source coupled to a power supply and to a source of said second P-type transistor wherein said second P-type transistor includes a gate coupled to an input of said second inverter;

a gate of said first P-type transistor coupled to a gate of said first N-type transistor wherein said gate of said first N-type transistor is connected to a clock;

a source of said second N-type transistor coupled to said shared common node; and a gate of said first N-type transistor connected to said output of said first inverter.

8. The decoder apparatus of claim 7 wherein said at least one address is encoded in a 2B encoded format.

9. A method for utilizing an improved multiple decoder circuit for a memory-array wherein a decoding operational rate is increased, resulting in faster memory-array read operations, comprising the steps of:

during an evaluate phase:

selecting only one row for any address combinational input to said decoder apparatus;

charging the clock to a voltage potential in order to turn off at least two PMOS devices located in a footed domino circuit within said decoder circuit wherein said footed domino circuit includes an NMOS pull-down device having a source coupled to ground and a drain coupled to a common shared node;

selecting a row or wordline by charging said row or wordline to said voltage potential when said address inputs rise to said voltage potential;

charging to ground a node coupled to a wordline driver circuit;

feeding said node to said wordline driver circuit such that said wordline driver circuit thereafter is charged to said voltage potential;

connecting said common shared node to a plurality of decoder circuits such that each decoder circuit among said plurality of decoder circuit shares said common shared node; and during a precharge phase, grounding a clock signal input and charging said node coupled to a wordline driver circuit to said voltage potential through at least two PMOS devices in a footed domino circuit such that said wordline drive is maintained at a zero voltage potential.

10. A method for implementing an improved decoder apparatus for memory-array read operations, comprising the steps of:

providing a plurality of row decoder circuits wherein each row decoder circuit among said plurality of row decoder circuits includes a footed domino circuit having a pull-down device located within a pull-down path of said footed domino circuit; and including among said plurality of row decoder circuits a shared common node coupled to each pull-down device wherein said shared common node allows a pull-down strength of each pull-down device to be increased according to the number of row decoder circuits having said shared common node, thereby promoting increased decoding operational rates and faster memory-array read operations.

11. The method of claim 10 further comprising the step of modifying said pull-down device to comprise an N-type pull-down device.

12. The method of claim 11 further comprising the steps of:

coupling an address decoder to said footed domino circuit, wherein said address decoder receives a plurality of address inputs and combines said plurality of address inputs into a single digital signal for utilization by said decoder apparatus; and connecting a wordline driver circuit to said footed domino circuit, wherein said wordline driver circuit provides an output of said decoder apparatus to a wordline such that said address decoder and said wordline driver circuit comprise said row decoder circuit.

13. The method of claim 12 further comprising the steps of coupling a NAND gate which includes an output and at least one input to at least one address; and connecting a first inverter which includes an output and an input to said output of said NAND gate such that said first inverter and said NAND gate comprise said address predecoder.

14. The method of claim 13 further comprising the step of:

modifying said wordline driver circuit to further comprise a third inverter having an output connected to a wordline and an input coupled to an input of a second inverter.

15. The decoder apparatus of claim 14 further comprising the steps of:

modifying said N-type pull-down device to comprise a first N-type transistor;

connecting a source of said first N-type transistor is to ground; and coupling a drain of said first N-type transistor to said shared common node.

16. The method of claim 15 further comprising the step of:

modifying said footed domino circuit to further comprise:

said input of said second inverter coupled to a drain of a second P-type transistor and to a drain of a first P-type transistor and to a drain of a second N-type transistor;

said first P-type transistor having a source coupled to a power supply and to a source of said second P-type transistor wherein said second P-type transistor includes a gate coupled to an input of said second inverter;

a gate of said first P-type transistor coupled to a gate of said first N-type transistor wherein said gate of said first N-type transistor is connected to a clock;

a source of said second N-type transistor coupled to said shared common node; and a gate of said first N-type transistor connected to said output of said first inverter.

* * * * *